United States Patent [19]

Takahashi

[11] Patent Number: 5,373,521
[45] Date of Patent: Dec. 13, 1994

[54] BLUE LIGHT EMITTING SEMICONDUCTOR DEVICE AND METHOD OF FABRICATING THE SAME

[75] Inventor: Yasuhito Takahashi, Osaka, Japan

[73] Assignee: Matsushita Electric Industrial Co., Ltd., Osaka, Japan

[21] Appl. No.: 94,598

[22] Filed: Jul. 21, 1993

[30] Foreign Application Priority Data

Sep. 22, 1992 [JP] Japan ................... 4-252475

[51] Int. Cl.$^5$ .............................. H01S 3/19
[52] U.S. Cl. ........................... 372/45; 372/46
[58] Field of Search ............. 372/43, 45, 46; 357/17

[56] References Cited

U.S. PATENT DOCUMENTS

| | | | |
|---|---|---|---|
| 4,631,731 | 12/1986 | Wolter et al. | 372/43 X |
| 4,792,958 | 12/1988 | Ohba et al. | 372/45 |
| 4,794,606 | 12/1988 | Kondow et al. | 372/45 |
| 5,045,894 | 9/1991 | Migita et al. | 357/17 |
| 5,093,696 | 3/1992 | Kinoshita | 372/45 X |
| 5,179,566 | 1/1993 | Iwano et al. | 372/45 |

OTHER PUBLICATIONS

"Blue and Green Diode Lasers in ZnSe-based Quantum Wells", Jeon et al., Applied Physics Letters, vol. 60 No. 17, 27 Apr., 1992, pp. 2045-2047.
"Blue-green laser diodes" by M. A. Haase et al; Appl. Phys. Lett., vol. 59, No. 11: Sep. 9, 1991: pp., 1272-1274.

Primary Examiner—Rodney B. Bovernick
Assistant Examiner—Hemang Sanghavi
Attorney, Agent, or Firm—Lowe, Price, LeBlanc & Becker

[57] ABSTRACT

A blue light emitting semiconductor device includes a first cladding layer, a second cladding layer, and an active layer. The first cladding layer includes a Group II-VI compound semiconductor of a first conduction type. The second cladding layer includes a Group II-VI compound semiconductor of a second conduction type different from the first conduction type. The active layer includes a Group II-VI compound semiconductor of the second conduction type, and extends between the first and second cladding layers a substrate includes a Group III-V compound semiconductor. At least two laminated buffer layers including Group III-V compound semiconductors extend between the first cladding layer and the substrate. An energy band gap at a position in the substrate, the buffer layers, and the first cladding layer varies stepwise as the position moves from the substrate to the first cladding layer via the buffer layers.

7 Claims, 4 Drawing Sheets

5,373,521

BLUE LIGHT EMITTING SEMICONDUCTOR DEVICE AND METHOD OF FABRICATING THE SAME

BACKGROUND OF THE INVENTION

1. Field of the Invention

This invention relates to a blue light emitting semiconductor device such as a blue light emitting semiconductor laser. This invention also relates to a method of fabricating a blue light emitting semiconductor device.

2. Description of the Prior Art

M. A. Haase et al reported in 1991 that laser diodes were fabricated from wide-band-gap II-VI semiconductors (Appl. Phys. Lett. 59(11), 1272-1274, September 1991). Their laser diodes had a ZnSe-based single-quantum-well structure, and emitted coherent light of a wavelength of 490 nm (blue-green) under pulsed current injection at 77K.

The laser diode of M. A. Haase et al has a laminated structure in which an In electrode layer, an $n^+$-GaAs substrate, an n-GaAs buffer layer, an $n^+$-ZnSe layer, an n-ZnSSe layer, an n-ZnSe layer, an undoped CdZnSe layer, a p-ZnSe layer, a p-ZnSSe layer, a $p^+$-ZnSe layer, a polyimide layer, and an Au electrode layer are arranged in the order. The CdZnSe layer defines a light emitting region (an active layer) providing a quantum well. The CdZnSe layer, that is. the active layer, has a thickness of about 10 nm. The n-ZnSe layer and the p-ZnSe layer are light guiding layers between which the CdZnSe layer (active layer) extends. The $p^+$-ZnSe layer forms a cap layer. The polyimide layer has a stripe groove in which the $p^+$-ZnSe layer and the Au electrode layer directly contact with each other. The stripe groove in the polyimide layer provides current confinement.

In the laser diode of M. A. Haase et al, the carrier concentration of the $p^+$-ZnSe layer (cap layer) is approximately equal to $10^{17}$ cm$^{-3}$, and this value of the carrier concentration tends to be inadequate to provide good ohmic contact with the Au electrode layer. Generally, in laser diodes, a small contact resistance at an electrode is desirable since a large contact resistance causes heat and a reduction in carrier injection efficiency.

In the laser diode of M. A. Haase et al, great lattice mismatches tend to occur among the n-ZnSe layer (light guiding layer), the CdZnSe layer (active layer), and the p-ZnSe layer (light guiding layer).

SUMMARY OF THE INVENTION

It is an object of this invention to provide an improved blue light emitting semiconductor device.

It is another object of this invention to provide a method of fabricating an improved blue light emitting semiconductor device.

A first aspect of this invention provides a blue light emitting semiconductor device comprising a first cladding layer including a Group II-VI compound semiconductor of a first conduction type; a second cladding layer including a Group II-VI compound semiconductor of a second conduction type different from the first conduction type; an active layer including a Group II-VI compound semiconductor of the second conduction type and extending between the first and second cladding layers; a substrate including a Group III-V compound semiconductor; and at least two laminated buffer layers including Group III-V compound semiconductors and extending between the first cladding layer and the substrate; wherein an energy band gap at a position in the substrate, the buffer layers, and the first cladding layer varies stepwise as the position moves from the substrate to the first cladding layer via the buffer layers.

A second aspect of this invention provides a method of fabricating a blue light emitting semiconductor device including a combination of a first cladding layer made of a Group II-VI compound semiconductor of a first conduction type, a second cladding layer made of a Group II-VI compound semiconductor of a second conduction type different from the first conduction type, and an active layer made of a Group II-VI compound semiconductor of the second conduction type and extending between the first second cladding layers, the method comprising the steps of forming a first buffer layer of a GaInP crystal semiconductor on a GaAs crystal semiconductor substrate, the first buffer layer being lattice-matched to the substrate; forming a second buffer layer of an AlGaInP crystal semiconductor on the first buffer layer, the second buffer layer being lattice-matched to the substrate; etching a surface of the second buffer layer; and forming said combination on the second buffer layer after the etching step.

A third aspect of this invention provides a blue light emitting semiconductor device comprising a first cladding layer including a Group II-VI compound semiconductor of a first conduction type and having a constricted portion; a second cladding layer including a Group II-VI compound semiconductor of a second conduction type different from the first conduction type; an active layer including a Group II-VI compound semiconductor of the second conduction type and extending between the first and second cladding layers; a substrate including a Group III-V compound semiconductor; and at least two laminated buffer layers including Group III-V compound semiconductors and extending between the first cladding layer and the substrate, the buffer layers being lattice-matched to the substrate; and an ion-implanted region adjoining the constricted portion of the first cladding layer and having a predetermined high resistivity; wherein an energy band gap at a position in the substrate, the buffer layers, and the first cladding layer varies stepwise as the position moves from the substrate to the first cladding layer via the buffer layers.

A fourth aspect of this invention provides a method of fabricating a blue light emitting semiconductor device which comprises the steps of forming at least two laminated buffer layers of Group III-V compound semiconductors on a substrate of a Group III-V compound semiconductor, the buffer layers being lattice-matched to the substrate; forming a lower portion of a first cladding layer on the buffer layers, the first cladding layer including a Group II-VI compound semiconductor of a first conduction type: forming a mask on the lower portion of the first cladding layer, the mask having a stripe shape with a predetermined width; implanting ion into an area of the lower portion of the first cladding layer, which is uncovered from the mask, to change said area into a high resistivity region; removing the mask; forming an upper portion of the first cladding layer on the lower portion of the first cladding layer and the high resistivity region; forming an active layer on the upper portion of the first cladding layer, the active layer including a Group II-VI compound semiconductor of a second conduction type different from the first conduction type; and forming a second cladding layer on the active layer, the second cladding layer including a Group II-VI compound semiconductor of the second conduction type.

A fifth aspect of this invention provides a blue light emitting semiconductor device comprising a first cladding layer including a Group II-VI compound semiconductor of a first conduction type; a second cladding layer including a Group II-VI compound semiconductor of a second conduction type different from the first conduction type, the second cladding layer having a mesa: an active layer including a Group II-VI compound semiconductor of the second conduction type and extending between the first and second cladding layers; a substrate including a Group III-V compound semiconductor; a multilayer buffer extending between the first cladding layer and the substrate, and including layers of Group III-V compound semiconductors which are lattice-matched to the substrate and a layer of a Group II-VI compound semiconductor; and a current confinement layer including a Group II-VI compound semiconductor of the first conduction type and extending on sides of the mesa and an area of the second cladding layer which extends outside the mesa.

A sixth aspect of this invention provides a method of fabricating a blue light emitting semiconductor device which comprises the steps of forming a first cladding layer of a Group II-VI compound semiconductor of a first conduction type; forming an active layer on the first cladding layer, the active layer including a Group II-VI compound semiconductor of a second conduction type different from the first conduction type; forming a second cladding layer on the active layer, the second cladding layer including a Group II-VI compound semiconductor of the second conduction type; making the second cladding layer into a shape having a mesa; and forming a current confinement layer on sides of the mesa and an area of the second cladding layer which extends outside the mesa, the current confinement layer including a Group II-VI compound semiconductor of the first conduction type.

DESCRIPTION OF THE PREFERRED EMBODIMENTS

Figure 1:
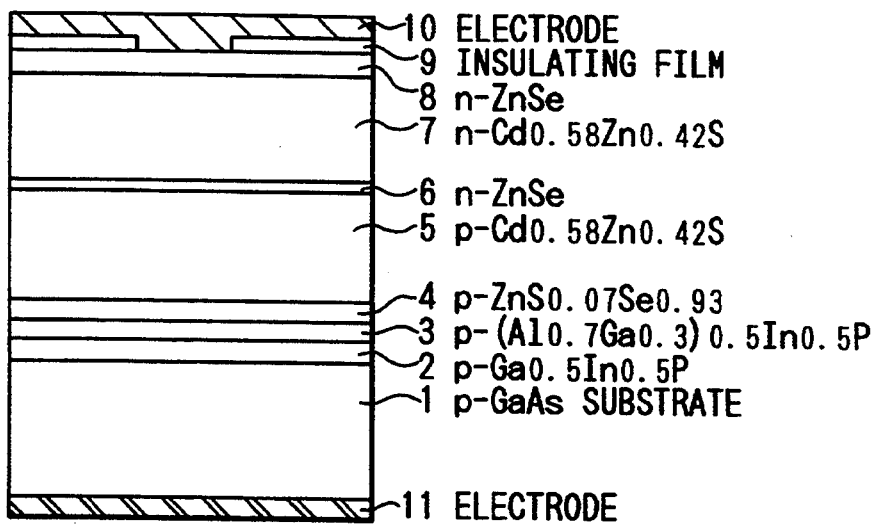
FIG. 1 is a sectional view of a first example of a blue light emitting semiconductor device of this invention.

According to a first embodiment of this invention, a blue light emitting semiconductor device includes a first cladding layer, a second cladding layer, an active layer, and a substrate. The first cladding layer includes a Group II-VI compound semiconductor of a first conduction type. It is preferable that the first cladding layer is lattice-matched to the substrate. The first cladding layer is made of, for example, p-type $Cd_{0.58}Zn_{0.42}S$. The second cladding layer includes a Group II-VI compound semiconductor of a second conduction type different from the first conduction type. It is preferable that the second cladding layer is lattice-matched to the substrate. The second cladding layer is made of, for example, n-type $Cd_{0.58}Zn_{0.42}S$. The active layer includes a Group II-VI compound semiconductor of the second conduction type. The active layer is made of, for example, n-type ZnSe. The active layer extends between the first and second cladding layers. The substrate includes a Group III-V compound semiconductor, for example, p-type GaAs. A buffer layer including a Group III-V compound semiconductor extends between the first cladding layer and the substrate. It is preferable that the buffer layer is lattice-matched to the substrate.

The buffer layer may be of a multilayer or laminated structure which includes first and second layers of Group III-V compound semiconductors. The first buffer layer extends on the substrate. The second buffer layer extends on the first buffer layer. The first buffer layer is made of, for example, p-type $Ga_{0.5}In_{0.5}P$. The second buffer layer is made of, for example, p-type $(Al_{0.7}Ga_{0.3})_{0.5}In_{0.5}P$.

A buffer layer including a Group II-VI compound semiconductor may be provided between the Group III-V buffer layer and the first cladding layer. It is preferable that the Group II-VI buffer layer is lattice-matched to the substrate. The Group II-VI buffer layer is made of, for example, p-type $ZnS_{0.07}Se_{0.93}$.

An energy band gap at a position in the substrate, the buffer layers, and the first cladding layer varies stepwise as the position moves from the substrate to the first cladding layer via the buffer layers.

A method of fabricating the first-embodiment semiconductor device including the first and second buffer layers has a step of forming the first buffer layer on the substrate, and a step of forming the second buffer layer on the first buffer layer. The method also has a step of etching a surface of the second buffer layer, and a step of forming a layer combination on the second buffer layer after the etching step. The layer combination includes the first cladding layer, the active layer, and the second cladding layer.

A blue light emitting semiconductor device according to a second embodiment of this invention is similar to the semiconductor device of the first embodiment except for design changes indicated hereinafter. In the semiconductor device of the second embodiment, a first cladding layer has a constricted portion which adjoins an ion-implanted region having a predetermined high resistivity. The ion-implanted region provides current confinement.

A method of fabricating the semiconductor device of the second embodiment has a step of forming a lower portion of the first cladding layer on a buffer layer. The first cladding layer includes a Group II-VI compound semiconductor of a first conduction type. The method also has a step of forming a mask on the lower portion of the first cladding layer. The mask has a stripe shape with a predetermined width. Ion is implanted into an area of the lower portion of the first cladding layer, which is uncovered from the mask, to change the area into a high resistivity region. After the mask is removed, an upper portion of the first cladding layer is formed on the lower portion of the first cladding layer and the high resistivity region. An active layer is formed on the upper portion of the first cladding layer.

The active layer includes a Group II-VI compound semiconductor of a second conduction type different from the first conduction type. A second cladding layer is formed on the active layer. The second cladding layer includes a Group II-VI compound semiconductor of the second conduction type.

According to a third embodiment of this invention, a blue light emitting semiconductor device includes a first cladding layer, a second cladding layer, an active layer, and a substrate. The first cladding layer includes a Group II-VI compound semiconductor of a first conduction type. It is preferable that the first cladding layer is lattice-matched to the substrate. The first cladding layer is made of, for example, p-type $Cd_{0.58}Zn_{0.42}S$. The second cladding layer includes a Group II-VI compound semiconductor of a second conduction type different from the first conduction type. It is preferable that the second cladding layer is lattice-matched to the substrate. The second cladding layer is made of, for example, n-type $Cd_{0.58}Zn_{0.42}S$. The second cladding layer has a mesa. The active layer includes a Group II-VI compound semiconductor of the second conduction type. The active layer is made of, for example, n-type ZnSe. The active layer extends between the first and second cladding layers. The substrate includes a Group III-V compound semiconductor, for example, p-type GaAs.

A multilayer buffer extends between the first cladding layer and the substrate, and includes layers of Group III-V compound semiconductors which are lattice-matched to the substrate and a layer of a Group II-VI compound semiconductor. The layers in the multilayer buffer are made of, for example, p-type GaInP, p-type AlGaInP, and p-type ZnSe respectively. A current confinement layer includes a Group II-VI compound semiconductor of the first conduction type, and extends on sides of the mesa and an area of the second cladding layer which extends outside the mesa. The current confinement layer is made of, for example, p-type ZnSe. The current confinement layer may be composed of a high resistivity layer.

A method of fabricating the semiconductor device of the third embodiment has a step of forming a first cladding layer of a Group II-VI compound semiconductor of a first conduction type, and a step of forming an active layer on the first cladding layer. The active layer includes a Group II-VI compound semiconductor of a second conduction type different from the first conduction type. The method also has a step of forming a second cladding layer on the active layer. The second cladding layer includes a Group II-VI compound semiconductor of the second conduction type. The second cladding layer is made into a shape having a mesa. A current confinement layer is formed on sides of the mesa and an area of the second cladding layer which extends outside the mesa. The current confinement layer includes a Group II-VI compound semiconductor of the first conduction type. The current confinement layer may be composed of a high resistivity layer.

EXAMPLE 1

With reference to FIG. 1, a blue light emitting semiconductor device or laser includes a p-type GaAs substrate 1. A multilayer or laminated structure is formed on an upper surface of the substrate. 1. Specifically, a first buffer layer 2, a second buffer layer 3, a third buffer layer 4, a cladding layer 5, an active layer 6, a cladding layer 7, a cap layer 8 are sequentially formed or laminated on the upper surface the substrate 1 in the order.

The first buffer layer 2 is made of p-type $Ga_{0.5}In_{0.5}P$, and has a thickness of 100 nm. The second buffer layer 3 is made of p-type $(Al_{0.7}Ga_{0.3})_{0.5}In_{0.5}P$, and has a thickness of 100 nm. The third buffer layer 4 is made of p-type $ZnS_{0.07}Se_{0.93}$, and has a thickness of 100 nm. The cladding layer 5 is made of p-type $Cd_{0.58}Zn_{0.42}S$, and has a thickness of 800 nm. The active layer 6 forms a light emitting region. The active layer 6 is made of n-type ZnSe, and has a thickness of 40 nm. The cladding layer 7 is made of n-type $Cd_{0.58}Zn_{0.42}S$, and has a thickness of 800 nm. The cap layer 8 is made of n-type ZnSe, and has a thickness of 100 nm.

An insulating film 9 having a stripe groove is formed on the cap layer 8. The insulating film 9 has a thickness of 400 nm. The stripe groove in the insulating film 9 has a width of 10 μm. An electrode 10 including a layer is formed on the insulating film 9. The electrode 10 extends into the stripe groove in the insulating film 9. In the stripe groove of the insulating film 9, the electrode 10 and the cap layer 9 directly contact with each other. An electrode 11 including a layer is formed on the lower surface of the substrate 1.

The semiconductor device of FIG. 1 was fabricated as follows. First, a p-type GaAs substrate 1 was prepared. A first buffer layer 2 and a second buffer layer 3 were sequentially superposed on a surface of the substrate 1 at a substrate temperature of about 700° C. by metalorganic vapor phase epitaxy (MOVPE) while being lattice-matched to the substrate 1. The first buffer layer 2 was made of p-type $Ga_{0.5}In_{0.5}P$, and had a thickness of 100 nm. The second buffer layer 3 was made of p-type $(Al_{0.7}Ga_{0.3})_{0.5}In_{0.5}P$, and had a thickness of 100 nm. Dopant in the first buffer layer 2 and the second buffer layer 3 was Zn. After an oxide film was removed from the surface of the second buffer layer 3 by hydrochloric-acid-based or sulfuric-acid-based etchant, a third buffer layer 4 was formed on the second buffer layer 3 at a substrate temperature of 300° C. by molecular beam epitaxy (MBE). The third buffer layer 4 was made of p-type $ZnS_{0.07}Se_{0.93}$, and had a thickness of 100 nm. Dopant in the third buffer layer 4 was N. Thus, N radical was fed during the formation of the third buffer layer 4. It was preferable that the oxide film was removed from the surface of the second buffer layer 3 by H radical before the third buffer layer 4 was formed. During the formation of the third buffer layer 4, the substrate temperature was so low that P atom did not diffuse from the second buffer layer 3 into the third buffer layer 4, and that S atom and Se atom did not diffuse from the third buffer layer 4 into the second buffer layer 3. There was a chance of diffusion of Zn atom from the third buffer layer 4 into the second buffer layer 3, The diffusion of Zn atoms into the second buffer layer 3 was good since it resulted in a reduction in resistance of the second buffer layer 3.

Immediately after the formation of the third buffer layer 4, a cladding layer 5, an active layer 6, a cladding layer 7, and a cap layer 8 were sequentially superposed on the third buffer layer 4 at a substrate temperature of about 300° C. by MBE. The cladding layer 5 was made of p-type $Cd_{0.58}Zn_{0.42}S$, and had a thickness of 800 nm. The active layer 6 formed a light emitting region. The active layer 6 was made of n-type ZnSe, and had a thickness of 40 nm. The cladding layer 7 was made of n-type $Cd_{0.58}Zn_{0.42}S$, and had a thickness of 800 nm. The cap layer 8 was made of n-type ZnSe, and had a thickness of 100 nm. Dopant in the cladding layer 5 was N. Thus, N radical was fed during the formation of the cladding layer 5. Dopant in the active layer 6, the cladding layer 7, and the cap layer 8 was Cl.

An insulating film 9 having a stripe groove was formed on the cap layer 8. The insulating film 9 was made of, for example, polyimide, and had a thickness of 400 nm. The stripe groove in the insulating film 9 had a width of 10 μm. An electrode 10 including a layer was formed on the insulating film 9 by a suitable process such as vapor deposition. The electrode 10 extended into the stripe groove in the insulating film 9. In the stripe groove of the insulating film 9, the electrode 10 and the cap layer 9 directly contacted with each other. An electrode 11 including a layer was formed on an opposite surface of the substrate 1 by a suitable process such as vapor deposition. An In film or an In film containing several-percent Zn which was used for bonding the substrate 1 to a holder during MBE also served as a good ohmic electrode 11 on the substrate 1.

Figure 2:
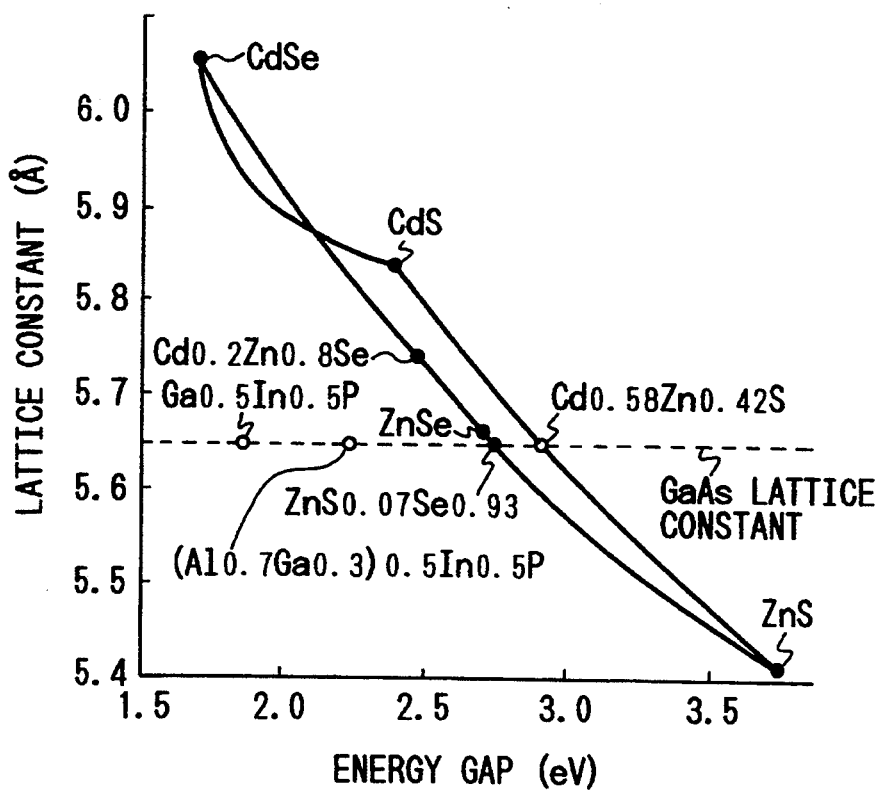
FIG. 2 is a diagram of lattice constants and energy band gaps of various crystals.

As understood from FIG. 2, the first buffer layer 2 made of p-type $Ga_{0.5}In_{0.5}P$, the second buffer layer 3 made of p-type $(Al_{0.7}Ga_{0.3})_{0.5}In_{0.5}P$, the third buffer layer 4 made of p-type $ZnS_{0.07}Se_{0.93}$, the cladding layer 5 made of p-type $Cd_{0.58}Zn_{0.42}S$, and the cladding layer 7 made of n-type $Cd_{0.58}Zn_{0.42}S$ are lattice-matched to the p-type GaAs substrate 1. Therefore, there occurs no strain, no lattice defect, and no lamination defect in the interfaces among the substrate 1 and the layers 2, 3, 4, 5, and 7. There is a lattice mismatch of 0.28% between the cladding layer 5 made of p-type $Cd_{0.58}Zn_{0.42}S$ and the active layer 6 made of n-type ZnSe. In addition, there is a lattice mismatch of 0.28% between the active layer 6 made of n-type ZnSe and the cladding layer 7 made of n-type $Cd_{0.58}Zn_{0.42}S$. In the case where the thickness of the active layer 6 is equal to or smaller than 40 nm, coherent crystal growth is enabled so that there is no lattice defect and no lamination defect in the interfaces among the active layer 6 and the cladding layers 5 and 7. In the case where the thickness of the cap layer 8 made of n-type ZnSe is equal to or smaller than 100 nm, strain occurring in the interface between the cap layer 8 and the cladding layer 7 is prevented from adversely affecting the active layer 6. Thus, provided that these conditions are satisfied, the semiconductor device of FIG. 1 can be fabricated substantially without strain.

Figure 3:
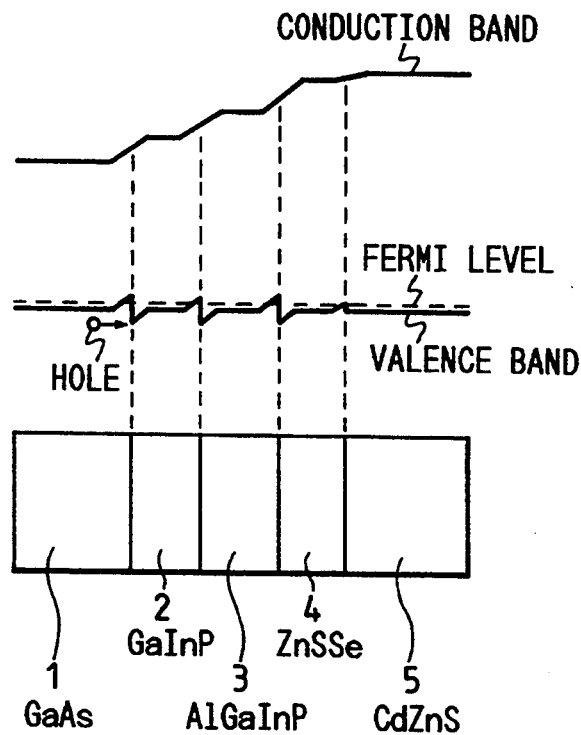
FIGS. 3 and 4 are diagrams of a structure of energy bands in the semiconductor device of FIG. 1.

As shown in FIG. 3, the energy band gap at a position in the substrate 1, the buffer layers 2, 3, and 4, and the cladding layer 5 increases stepwise as the position moves from the substrate 1 to the cladding layer 5 via the buffer layers 2, 3, and 4.

As shown in FIG. 3, the valence band has discontinuities at the boundaries between the substrate 1, the first buffer layer 2, the second buffer layer 3, the third buffer layer 4, and the cladding layer 5 so that there are corresponding potential barriers at the boundaries. The first buffer layer 2 made of p-type $Ga_{0.5}In_{0.5}P$ and the second buffer layer 3 made of p-type $(Al_{0.7}Ga_{0.3})_{0.5}In_{0.5}P$ can be doped to a carrier concentration of up to $10^{18}$ cm$^{-3}$ without impairing the crystalline characteristics thereof. The heights of The potential barriers between the substrate 1 and the layers 2-5 are equal to or smaller than 0.4 eV. In addition, the widths of the potential barriers are small at large carrier concentrations of the substrate 1 and the layers 2-5. Thus, holes can easily tunnel through the potential barriers so that a high efficiency of hole injection can be attained.

Figure 4:
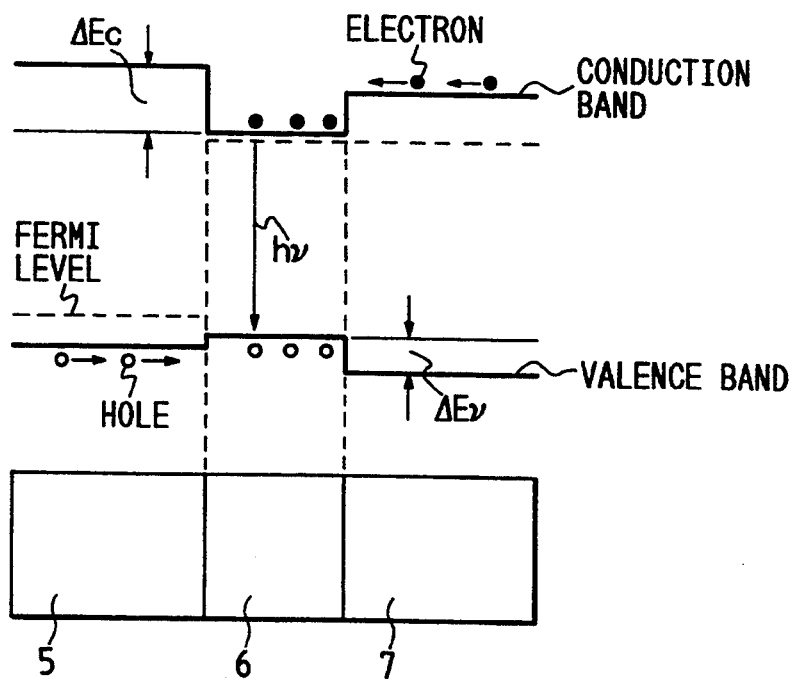

As shown in FIG. 4, the energy band structure in the cladding layer 5, the active layer 6, and the cladding layer 7 is of the type "I". Specifically, the conduction band has discontinuities at the boundaries between the cladding layer 5, the active layer 6, and the cladding layer 7 so that there are corresponding potential barriers at the boundaries. A potential well (a quantum well) is formed in the conduction band by these potential barriers. The bottom of the quantum well corresponds to the active layer 6. The quantum well in the conduction band acts on electrons. The potential barrier ΔEc which defines the quantum well in the conduction band has a height of 150-180 meV so that electrons can be efficiently trapped or confined in the active layer 6. The valence band also has discontinuities at the boundaries between the cladding layer 5, the active layer 6, and the cladding layer 7 so that there are corresponding potential barriers at the boundaries. A potential well (a quantum well) is formed in the valence band by these potential barriers. The bottom of the quantum well corresponds to the active layer 6. The quantum well in the valence band acts on holes. The potential barrier ΔEv which defines the quantum well in the valence band has a height of about 80 meV so that holes can be efficiently trapped or confined in the active layer 6.

Figure 5:
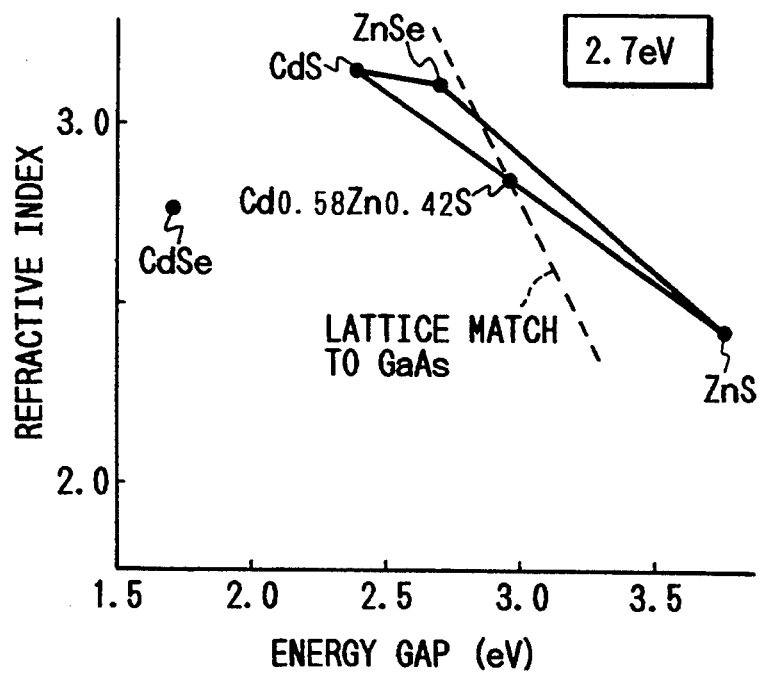
FIG. 5 is a diagram of refractive indexes and energy band gaps of various crystals.

As shown in FIG. 4, the energy band gap in the active layer 6 corresponds to light energy "hv". As shown in FIG. 5, the energy band gap in the ZnSe layer 6 is equal to 2.7 eV. In addition, with respect to light of energy equal to 2.7 eV, the refractive index of the ZnSe layer 6 is equal to 3.08 while the refractive index of the $Cd_{0.58}Zn_{0.42}S$ layers (cladding layers) 5 and 7 is equal to 2.76. Thus, the difference in refractive index between the cladding layer 5 and the active layer 6 and the difference in refractive index between the active layer 6 and the cladding layer 7 are sufficiently large so that light can be efficiently trapped or confined in the active layer 6. For example, the light confinement (trap) coefficient is equal to 0.2 in the case where the active layer 6 has a thickness of 40 nm. In addition, the light confinement (trap) coefficient is equal to 0.37 in the case where the active layer 6 has a thickness of 60 nm.

The buffer layers 2, 3, and 4 enable a small internal resistance of the semiconductor device of FIG. 1. As previously described, in the semiconductor device of FIG. 1, a high efficiency of hole injection is attained. Thus, the semiconductor device of FIG. 1 can oscillate at a low drive voltage, for example, about 3 V.

EXAMPLE 2

Figure 7:
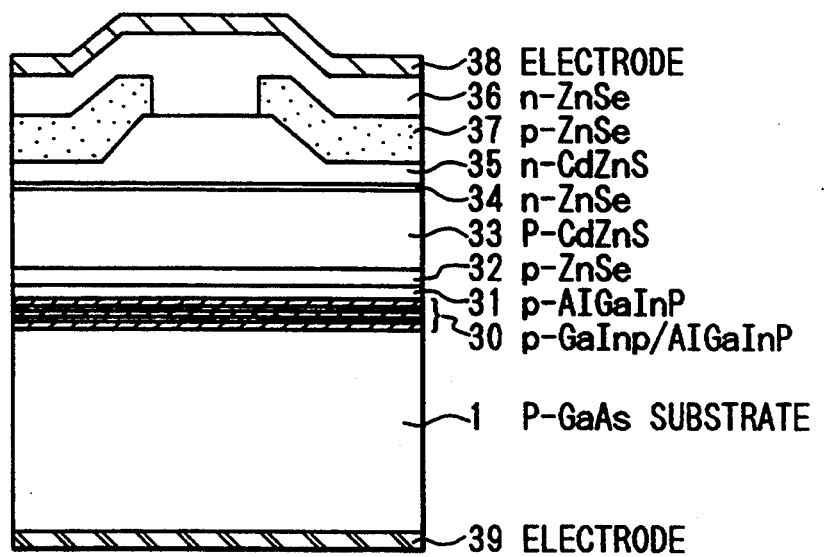
FIG. 7 is a sectional view of a third example of a blue light emitting semiconductor device of this invention.

FIG. 7 shows a second example which is similar to the example of FIG. 1 except for design changes indicated hereinafter.

Figure 6:
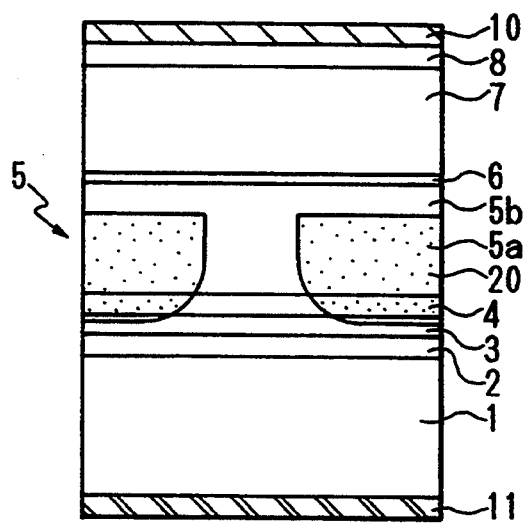
FIG. 6 is a sectional view of a second example of a blue light emitting semiconductor device of this invention.

The insulating film 9 of FIG. 1 is omitted from the example of FIG. 6. An electrode 10 in the form of a layer extends on a cap layer 8 in the example of FIG. 6.

As shown in FIG. 6, portions of a second buffer layer 3, a third buffer layer 4, and a cladding layer 5 are changed into a high resistivity region 20. The high resistivity region 20 has a stripe groove or opening which is occupied by unchanged portions (normal portions) of the second buffer layer 3, the third buffer layer 4, and the cladding layer 5. The high resistivity region 20 provides current confinement. The cladding layer 5 is divided into a lower portion 5a and an upper portion 5b.

A semiconductor device according to the example of FIG. 6 was fabricated as follows. After p-type $Cd_{0.58}Zn_{0.42}S$ was grown into a sub cladding layer 5a having a thickness of 1 μm, a stripe-shaped mask having a width of 10 μm was formed on the sub cladding layer 5a. The mask was an insulating film made of $SiO_2$ or SiN, or was a metal film made of Cr. Then, ion such as proton, $Li^+$ ion, or $N^+$ ion was implanted into the semiconductor body with the mask along a direction tilted at an angle of 7 degrees. The ion implantation was executed seven times at a room temperature. The related ion implantation energy was set to 200 keV. As a result of the ion implantation, portions of a second buffer layer 3, a third buffer layer 4, and the sub cladding layer 5a which extended outward of the mask were changed into a region 20 having a high resistivity, for example, $10^3$ Ωcm. The depth or thickness of the high resistivity region 20 was preferably equal to about 1 μm. The dose amount in the high resistivity region 20 was preferably equal to $5 \times 10^{14} cm^{-2}$.

After the mask was removed, the surface of the semiconductor body was etched by liquid for a predetermined short time. The liquid had a mixture of $H_2SO_4$ and $K_2Cr_2O_7$. For example, the mixing ratio of $H_2SO_4$ to $K_2Cr_2O_7$ was 2 to 3. Then, the semiconductor body was placed into a chamber for MBE again. An oxide film which remained on the sub cladding layer 5a and the high resistivity region 20 was removed by H radical. Subsequently, p-type $Cd_{0.58}Zn_{0.42}S$ was grown into a sub cladding layer 5b extending on the sub cladding layer 5a and the high resistivity region 20. The sub cladding layer 5b had a thickness of 200 nm. The sub cladding layers 5a and 5b composed a cladding layer 5. Then, an active layer 6, a cladding layer 7, a cap layer 8, and an electrode 10 were sequentially superposed on the cladding lawyer 5. During the formation of the sub cladding layer 5b, the active layer 6, the cladding layer 7, the cap layer 8, and the electrode 10, the growth temperature was maintained at a low temperature, for example, 300° C. This low growth temperature prevented proton. $Li^+$ ion, or $N^+$ ion from diffusing out of the high resistivity region 20.

In the semiconductor device of FIG. 6, an effective area of the electrode 10 is large so that a small resistance at the contact between the electrode 10 and the cap layer 8 can be attained. The contact between the electrode 10 and the cap layer 8 has a large area. This is advantageous in heat radiation from the semiconductor device. The threshold current is small, and the semiconductor device of FIG. 6 can continuously oscillate with a current of 30 mA or less at a room temperature.

EXAMPLE 3

With reference to FIG. 7, a blue light emitting semiconductor device or laser includes a p-type GaAs substrate 1. A laminated structure is formed on an upper surface of the substrate 1. Specifically, a first buffer film 30, a second buffer layer 31, a third buffer layer 32, a cladding layer 33, an active layer 34, and a cladding layer 35 are sequentially formed or laminated on the upper surface the substrate 1 in the order.

The first buffer film 30 includes a multilayer film having sub layers of first and second types. The first-type sub layers alternate with the second-type sub layers. A lowermost first-type sub layer extends immediately above the substrate 1. An uppermost first-type sub layer extends immediately below the second buffer layer 31. The first-type sub layers are made of p-type GaInP (that is, p-type $Ga_xIn_{1-x}P$), and have a thickness of 10 nm. The second-type sub layers are made of p-type AlGaInP (that is, p-type $(Al_yGa_{1-y})_zIn_{1-z}P$), and have a thickness of 4 nm. The compositions of the sub layers are chosen so that the lattice constant of a portion of the multilayer film 30 will gradually change from the lattice constant of GaAs toward the lattice constant of ZnSe as the portion moves from the lowermost position to the uppermost position within the multilayer film 30.

The second buffer layer 31 is made of p-type AlGaInP (that is, p-type $(Al_yGa_{1-y})_zIn_{1-z}P$), and has a thickness of 100 nm. The composition of the second buffer layer 31 is chosen so that the second sub layer 31 can be lattice-matched to ZnSe. The third buffer layer 32 is made of p-type ZnSe, and has a thickness of 100 nm. The cladding layer 33 is made of p-type CdZnS (that is, p-type $Cd_xZn_{1-x}S$), and has a thickness of 800 nm. The composition of the cladding layer 33 is chosen so that the cladding layer 33 can be lattice-matched to ZnSe. The active layer 34 forms a light emitting region. The active layer 34 is made of n-type ZnSe, and has a thickness of 40 nm. The cladding layer 35 is made of n-type CdZnS (that is, p-type $Cd_xZn_{1-x}S$). The composition of the cladding layer 35 is chosen so that the cladding layer 35 can be lattice-matched to ZnSe. The cladding layer 35 has a mesa with a thickness of 800 nm.

A p-type ZnSe layer 37 extends on the cladding layer 35. The p-type ZnSe layer 37 has a stripe groove or opening at the top of the mesa of the cladding layer 35. An n-type ZnSe layer 36 is formed on the p-type ZnSe layer 37. The n-type ZnSe layer 36 extends into the groove in the p-type ZnSe layer 37, and directly contacts the cladding layer 35. The p-type ZnSe layer 37 provides current confinement. An electrode 38 having a layer shape extends on the n-type ZnSe layer 36. In addition, an electrode 39 including a layer is formed on the lower surface of the substrate 1.

The semiconductor device of FIG. 7 was fabricated as follows. First, a p-type GaAs substrate 1 was prepared. Sub layers of a multilayer film (first buffer film) 30 were sequentially formed on a surface of the substrate 1 at a substrate temperature of about 700° C. by metalorganic vapor phase epitaxy (MOVPE). The sub layers of the multilayer film 30 were of first and second types. The first-type sub layers alternated with the second-type sub layers. A lowermost first-type sub layer extended immediately above the substrate 1. An uppermost sub layer of the multilayer film 30 was of the first type. The first-type sub layers were made of p-type GaInP (that is, p-type $Ga_xIn_{1-x}P$), and had a thickness of 10 nm. The second-type sub layers were made of p-type AlGaInP (that is, p-type $(Al_yGa_{1-y})_zIn_{1-z}P$), and had a thickness of 4 nm. During the formation of the sub layers of the multilayer film 30, the compositions of the sub layers were adjusted so that the lattice constant of a portion of the multilayer film 30 would gradually change from the lattice constant of GaAs toward the lattice constant of ZnSe as the portion moves from the lowermost position to the uppermost position within the multilayer film 30.

Subsequently, a second buffer layer 31 was formed on the multilayer film 30 by MOVPE. The second buffer layer 31 was made of p-type AlGaInP (that is, p-type $(Al_yGa_{1-y})_zIn_{1-z}P$), and had a thickness of 100 nm. The composition of the second buffer layer 31 was chosen so that the second sub layer 31 could be lattice-matched to ZnSe. Immediately after the formation of the second buffer layer 31, the semiconductor body was placed into a chamber for MBE. Then, an oxide film which remained on the second buffer layer 31 was removed by H radical, and a third buffer layer 32 was formed on the second buffer layer 31 by MBE. The third buffer layer 32 was made of p-type ZnSe, and had a thickness of 100 nm. Subsequently, a cladding layer 33, an active layer 34, and a cladding layer 35 were sequentially superposed on the third buffer layer 32 by MBE. The cladding layer 33 was made of p-type CdZnS (that is, p-type $Cd_xZn_{1-x}S$), and had a thickness of 800 nm. The cladding layer 33 was lattice-matched to ZnSe. The active layer 34 formed a light emitting region. The active layer 34 was made of n-type ZnSe, and had a thickness of 40 nm. The cladding layer 35 was made of n-type CdZnS (that is, p-type $Cd_xZn_{1-x}S$). The cladding layer 35 was lattice-matched to ZnSe, and had a thickness of 800 nm. During MBE to form the third buffer layer 32, the cladding layer 33, the active layer 34, and the cladding layer 35, the growth temperature was maintained at 300° C.

Then, the semiconductor body was removed from the MBE chamber. A stripe resist was formed on a given area of the cladding layer 35. The stripe resist was made of an oxide film, and had a width of 2 μm and a thickness of 400 nm. The semiconductor body with the stripe resist was etched by liquid. The liquid had a mixture of $H_2SO_4$ and $K_2Cr_2O_7$. For example, the mixing ratio of $H_2SO_4$ to $K_2Cr_2O_7$ was 2 to 3. As a result of the etching process, the cladding layer 35 was made into a shape having a mesa. Immediately after the etching process was completed, the semiconductor body was placed into the MBE chamber again. An oxide film which remained on the cladding layer 35 was removed by H radical, and a p-type ZnSe layer 37 was formed on the exposed area of the cladding layer 35 by MBE. During the formation of the p-type ZnSe layer 37, the growth temperature was maintained at 280° C. Since the stripe resist was made of the oxide film, the p-type ZnSe layer 37 was grown on only the area uncovered from the stripe resist. In this way, selective epitaxy was executed with respect to the p-type ZnSe layer 37. Thus, the p-type ZnSe layer 37 had a stripe groove or opening at the top of the mesa of the cladding layer 35. Then, the semiconductor body was taken out from the MBE chamber again, and the stripe resist was removed from the semiconductor body. Immediately after the removal of the stripe resist, the semiconductor body was placed into the MBE chamber again. An oxide film which remained on the cladding layer 35 and the p-type ZnSe layer 37 was removed by H radical, and an n-type ZnSe layer 36 was formed on the cladding layer 35 and the p-type ZnSe layer 37 by MBE. The n-type ZnSe layer 36 extended into the groove in the p-type ZnSe layer 37, and directly contacted the cladding layer 35. An electrode 38 having a layer shape was formed on the n-type ZnSe layer 36. An electrode 39 including a layer was formed on an opposite surface of the substrate 1 by a suitable process such as vapor deposition. An In film or an In film containing several-percent Zn which was used for bonding the substrate 1 to a holder during MBE also served as a good ohmic electrode 39 on the substrate 1.

The operation and function of the semiconductor device of FIG. 7 is basically similar to those of the semiconductor device of FIG. 1. The semiconductor device of FIG. 7 has the following features. The threshold current is small, and the semiconductor device of FIG. 7 can continuously oscillate with a current of 30 mA or less at a room temperature. The output light beam from the semiconductor device of FIG. 7 has an aspect ratio of 2.5.

OTHER EXAMPLES

A fourth example is similar to the example of FIG. 1, FIG. 6, or FIG. 7 except that cladding layers are made of a mixed crystal containing Mn or Mg, such as a mixed crystal of ZnMnSSe or ZnMgSSe, which is lattice-matched to a GaAs substrate or a ZnSe crystal.

A fifth example is similar to the example of FIG. 1, FIG. 6, or FIG. 7 except that MBE was replaced by MOVPE and thus layers were formed by MOVPE only.

A sixth example is similar to the example of FIG. 1, FIG. 6, or FIG. 7 except that $Zn\{N[Si(CH_3)_3]_2\}_2$ was used as p-type dopant.

What is claimed is:

1. A blue light emitting semiconductor device comprising:
    a first cladding layer including a Group II-VI compound semiconductor of a first conduction type;
    a second cladding layer including a Group II-VI compound semiconductor of a second conduction type different from the first conduction type;
    an active layer including a Group II-VI compound semiconductor of the second conduction type and extending between the first and second cladding layers;
    a substrate including a Group III-V compound semiconductor; and
    at least two laminated buffer layers including Group III-V compound semiconductors and extending between the first cladding layer and the substrate;
    wherein an energy band gap at a position in the substrate, the buffer layers, and the first cladding layer increases in a stepwise configuration with steps at respective boundaries between the substrate, the buffer layers and the first cladding layer as the position moves from the substrate to the first cladding layer via the buffer layers.

2. The blue light emitting semiconductor device of claim 1, wherein the substrate includes a p-type GaAs crystal, the buffer layers include a layer of a p-type GaInP crystal which is lattice-matched to the substrate and a layer of a p-type AlGaInP crystal which is lattice-matched to the substrate, the first cladding layer includes a p-type CdZnS crystal which is lattice-matched to the substrate, the active layer includes an n-type ZnSe crystal, and the second cladding layer includes an n-type CdZnS crystal which is lattice-matched to the substrate.

3. The blue light emitting semiconductor device of claim 1, wherein the substrate, the buffer layers, and the first cladding layer are lattice-matched to each other.

4. A blue light emitting semiconductor device comprising:
    a first cladding layer including a Group II-VI compound semiconductor of a first conduction type and having a constricted portion;
    a second cladding layer including a Group II-VI compound semiconductor of a second conduction type different from the first conduction type;
    an active layer including a Group II-VI compound semiconductor of the second conduction type and extending between the first and second cladding layers;
    a substrate including a Group III-V compound semiconductor; and at least two laminated buffer layers including Group III-V compound semiconductors and extending between the first cladding layer and the substrate, the buffer layers being lattice-matched to the substrate; and an ion-implanted region adjoining the constricted portion of the first cladding layer and having a predetermined high resistivity;

wherein an energy band gap at a position in the substrate, the buffer layers, and the first cladding layer increases in a stepwise configuration with steps at respective boundaries between the substrate, the buffer layers, and the first cladding layer as the position moves from the substrate to the first cladding layer via the buffer layers.

5. The blue light emitting semiconductor device of claim 4, wherein the substrate, the buffer layers, and the first cladding layer are lattice-matched to each other.

6. A blue light emitting semiconductor device comprising:

a first cladding layer including a Group II-VI compound semiconductor of a first conduction type;

a second cladding layer including a Group II-VI compound semiconductor of a second conduction type different from the first conduction type, the second cladding layer having a mesa;

an active layer including a Group II-VI compound semiconductor of the second conduction type and extending between the first and second cladding layers;

a substrate including a Group III-V compound semiconductor;

a multilayer buffer extending between the first cladding layer and the substrate, and including layers of Group III-V compound semiconductors which are lattice-matched to the substrate and a layer of a Group II-VI compound semiconductor; and a current confinement layer including a Group II-VI compound semiconductor of the first conduction type and extending on sides of the mesa and an area of the second cladding layer which extends outside the mesa;

wherein an energy band gap at a position in the substrate, the layers of the buffer, and the first cladding layer increases in a stepwise configuration with steps at respective boundaries between the substrate, the layers of the buffer, and the first cladding layer as the position moves from the substrate to the first cladding layer via the layers of the buffer.

7. The blue light emitting semiconductor device of claim 6, wherein the substrate, the layers of the buffer, and the first cladding layer are lattice-matched to each other.

* * * * *